United States Patent [19]

Kim et al.

[11] Patent Number: 5,801,074
[45] Date of Patent: Sep. 1, 1998

[54] METHOD OF MAKING AN AIR TIGHT CAVITY IN AN ASSEMBLY PACKAGE

[76] Inventors: Jong Tae Kim, #301 Spacevilla, 741 Baugbae-Dong, Secho-Gu, Seoul, 137-069, Rep. of Korea; Chau Ik Park, 121-1 Sungbon-Ri, Daeso-Myun, Tsumsung-koon, Choongchungbook-Do, Rep. of Korea, 369-820; Chang Hyung Lee, 2-510 Woosung Apt, 1336 Secho-Dong, Secho-Gu, Seoul, 137-072, Rep. of Korea

[21] Appl. No.: 603,377

[22] Filed: Feb. 20, 1996

[51] Int. Cl.$^6$ ............................................. H01L 21/60
[52] U.S. Cl. .................... 438/125; 438/118; 438/126; 438/121
[58] Field of Search ...................... 437/215, 217, 437/216, 218, 209; 438/118, 121, 123, 125, 126

[56] References Cited

U.S. PATENT DOCUMENTS

| | | | |
|---|---|---|---|
| 3,602,985 | 9/1971 | Nosch | 437/216 |
| 3,844,822 | 10/1974 | Boss et al. | 117/119.6 |
| 3,962,520 | 6/1976 | Watanabe et al. | 428/414 |
| 4,004,151 | 1/1977 | Novak | |
| 4,139,726 | 2/1979 | Penrod et al. | 437/218 |
| 4,312,116 | 1/1982 | Moser et al. | |
| 4,410,905 | 10/1983 | Grabbe | 437/217 |
| 4,939,316 | 7/1990 | Mahulikar et al. | |
| 5,059,558 | 10/1991 | Tatsanakit et al. | 437/216 |
| 5,073,521 | 12/1991 | Braden | 437/217 |
| 5,465,481 | 11/1995 | Romero | 437/218 |
| 5,529,959 | 6/1996 | Yamanaka | 437/216 |
| 5,561,085 | 10/1996 | Gorowitz et al. | 437/218 |

FOREIGN PATENT DOCUMENTS

| | | | |
|---|---|---|---|
| 0-424-278-A | 4/1991 | European Pat. Off. | 437/215 |
| 57-201053 | 12/1982 | Japan | 437/215 |

*Primary Examiner*—Olik Chaudhuri
*Assistant Examiner*—Kevin F. Turner
*Attorney, Agent, or Firm*—Peter A. Borsari

[57] ABSTRACT

A method of making an assembly package having an airtight cavity for housing an electrical element, such as a semiconductor chip. The method includes bonding a shell to a conductive base with a thermally setting alpha-staged epoxy resin which is characterized as being a gel in the uncured state at room temperature. The use of the alpha-staged epoxy resin, in contrast with the conventional beta-staged epoxy resin, results in an airtight cavity being formed without punctures or fissures in the epoxy resin. The method also provides a two-step heating process whereby the epoxy resin is cured at a first elevated temperature in the open atmosphere and further cured and stabilized at a second elevated temperature in a closed environment.

11 Claims, 8 Drawing Sheets

BETA-STAGED THERMALLY SETTING EPOXY

ALPHA-STAGED THERMALLY SETTING EPOXY

Fig. 10

METHOD OF MAKING AN AIR TIGHT CAVITY IN AN ASSEMBLY PACKAGE

FIELD OF THE INVENTION

The present invention relates to a method of making an air tight cavity for holding an element therein and, in particular, to making an air tight cavity for a package containing a semiconductor chip such as GaAs semiconductor circuit chip designed to operate in gigaherz ranges and inventive products made by the inventive method.

BACKGROUND OF THE INVENTION

An element such as GaAs semiconductor circuit chip must be housed in an air tight cavity in an assembly package to assure that the chip functions in the environment in which it is designed to operate. Typically the assembly package is made of a conductive lead frame with a base and leads, a semiconductor chip, and a shell covering the base to form the cavity for the chip. The chip is bonded to the base of the lead frame and wire bonded to the leads of the lead frame. The cavity is formed by the shell covering the chip and the base. The base is backed by a backer plate or bonded to a molding plastic.

According to a known method of making a cavity for the assembly package, a layer of beta-staged, also known as B-staged, epoxy is applied to the lip of the shell and to the backer plate. Upon heating, the epoxy melt into a gel and bonds the backer plate to the bottom of the base and the shell lip to the top surface of the base and the frame leads. The package is heated to a first temperature in an oven for a given duration to harden the epoxy and then later in an enclosed oven at an elevated temperature for a predetermined duration to cure the hardened epoxy.

It has been found that known methods are difficult to apply, provide low production yield and poor quality products. A high percentage of the product made by the known method fail to past the industry standard condition "c" gross leak test and accelerated life cycle tests involving heating and freezing cycles.

SUMMARY OF THE INVENTION

In accordance with the present invention, there is provided an improved method of making an air tight cavity in an assembly package, by bonding a hollow shell to a base of the assembly package. The present invention also includes novel and inventive products made by the improved method. The method includes the steps of:

a) dispensing a thermally setting alpha-staged epoxy, also known as A-staged epoxy, in the gel state on the base, b) heating the base to a predetermined temperature, c) placing the shell on the epoxy so that the lip of the shell sits on the epoxy, whereby the epoxy bonds to the preheated base, d) heating and maintaining the assembly package in an open atmosphere at an elevated temperature for a duration long enough to cure the epoxy to seal the atmosphere in the cavity, wherein the pressure exerted on the epoxy by the force of the expanding atmosphere trying to escape from the cavity counteracts against the surface tension of the epoxy being cured, whereby the epoxy is cured without puncture and the cavity is made air tight, and e) heating and maintaining the assembly at another elevated temperature in an enclosed oven for a duration long enough to further cure and stabilize the epoxy.

According to a feature of the present invention, there is provided a method of making an air tight cavity in an assembly package that contains an element such as a semiconductor chip, wherein the air tight cavity is defined by a non-conductive hollow shell and a conductive lead frame made of a base and frame leads extending outwardly from the base. The method includes the steps of:

a) dispensing a thermally setting alpha-staged epoxy in a gel state on the frame leads and over one or more of the open channels disposed between the frame leads in a closed loop so that the loop of the epoxy will meet the lip of the shell, wherein the viscosity of the epoxy is a predetermined magnitude such that the surface tension of the epoxy prevents the epoxy from sagging and falling into the openings made by the channels, b) placing the shell on the lead frame so that the shell lip rests on the epoxy for forming the cavity, c) heating the lead frame and the epoxy in an oven at a predetermined elevated temperature for a predetermined duration to enable the epoxy to bond to the lip and the frame leads, harden the epoxy and begin to cure, d) flipping over the lead frame with the shell bonded thereto, e) heating and maintaining the lead frame at a predetermined temperature, f) dispensing a thermally setting alpha-staged epoxy with a predetermined viscosity on the leads of the preheated lead frame at the area above the cavity opposite to that defined and enclosed by the lip of the shell, g) heating and maintaining the package in an open atmosphere at an elevated temperature for a predetermined duration, wherein the epoxy has the viscosity of a magnitude such that its surface tension counteracts the atmosphere escaping from the cavity through the openings of the channels and counteracts the force of the gravity that tend to cause the epoxy to fall down through the openings toward the cavity, whereby the epoxy dispensed over the openings is held suspended in position, whereby an air tight sealed cavity is formed, as the epoxy hardens to cure, and h) heating the package in an oven at a predetermined temperature for a predetermined duration to stabilize the cured epoxy.

Yet a further aspect of the invention is a novel and inventive product made by the present invention. Thus, a semiconductor assembly package made by the present inventive method includes a shell with a relatively thick protruding lip with a tapered inner recess. The epoxy fills the space between the lip and the frame leads and the recess so that the epoxy bonding the lip to the base is substantially contiguous with the relatively thick portion of the lip. The epoxy forms a solid wall with the lip without protrusions oozing out from the space between the lip and the frame base onto the frame leads.

The foregoing and other aspects of the invention will be clearer in the detailed description in conjunction with the accompanying drawings.

DETAILED DESCRIPTION OF THE INVENTION

The present invention will be described in terms of methods of making an air tight cavity in a package containing a GaAs semiconductor chip and inventive product made by the inventive method with reference to the accompanying drawings. But it should be noted that the principles of the inventive method are not limited to making the cavity for the GaAs or any other type of semiconductor chips. The inventive method may be widely applied to make air tight cavities to contain any other types of products such as LCD, MMIC and other electronic or non-electronic elements. Likewise the inventive aspects of product is not limited to the GaAs semiconductor assembly package. It may be applied to other types of assembly packages.

DETAILED DESCRIPTION OF KNOWN ART

Figure 1A:
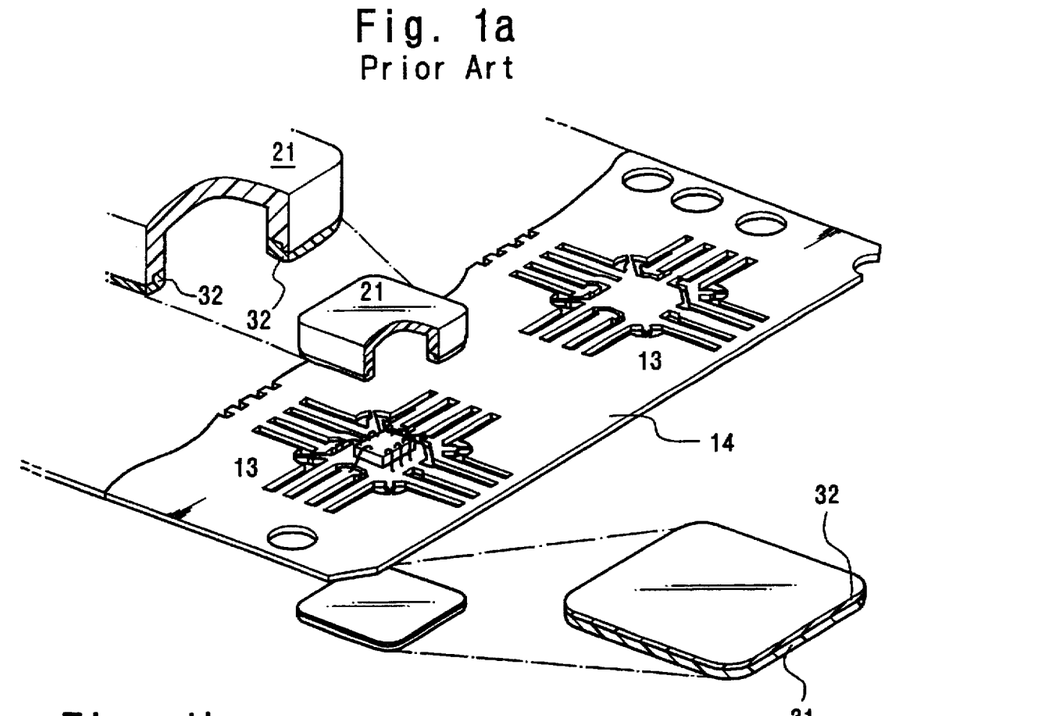
FIGS. 1, 3, 4 and 6 show various views of a semiconductor assembly package with a cavity for housing a GaAs chip made by a prior art method.
Figure 1B:
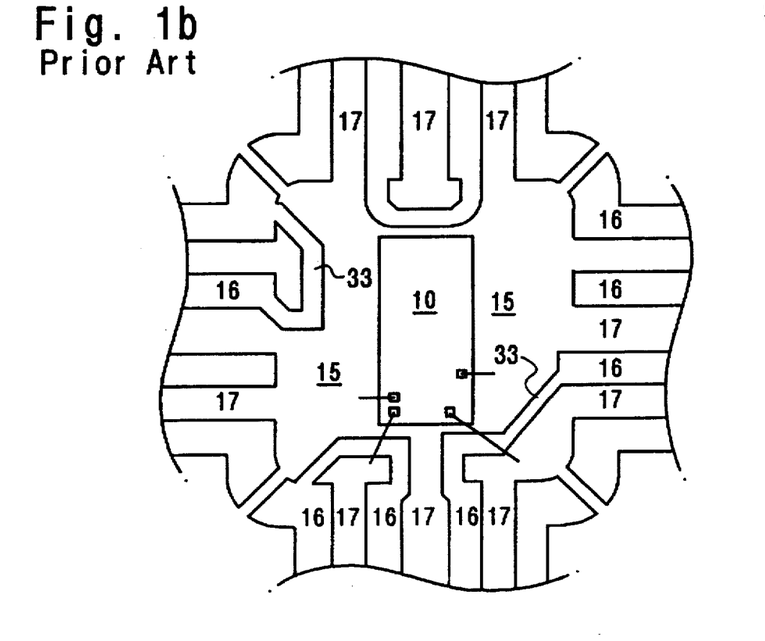

A known method of making in air tight cavity in a semiconductor package will be described with reference to FIGS. 1–4. As shown in FIGS. 1a and 1b an assembly package contains a GaAs semiconductor chip 10. The package includes a lead frame 13 made of the conductive plate 14. The bottom of the chip is bonded to the base 15 of the lead frame. The elements at the top of chip are wire bonded to the input and out put leads 17 of the lead frame. A shell 21 made of a non-conductive material covers the chip.

According to a known method, a beta stage molding epoxy compound is used to bond the shell to the frame input and output leads 17 to form the cavity for the GaAs chip. By heating a shell 21 tipped with epoxy 32 and a backer plate 31 coated with epoxy 32, the epoxy is made to melt into a gel state. The shell and the backer plate are pressed against the base. The epoxy bonds the shell and the backer plate to the leads and the base form a cavity. The resulting assembly package is placed in a closed oven for a predetermined duration at a predetermined temperature. This package is again placed in an oven at a higher temperature for another duration to cure and to stabilize the epoxy.

Figure 3:
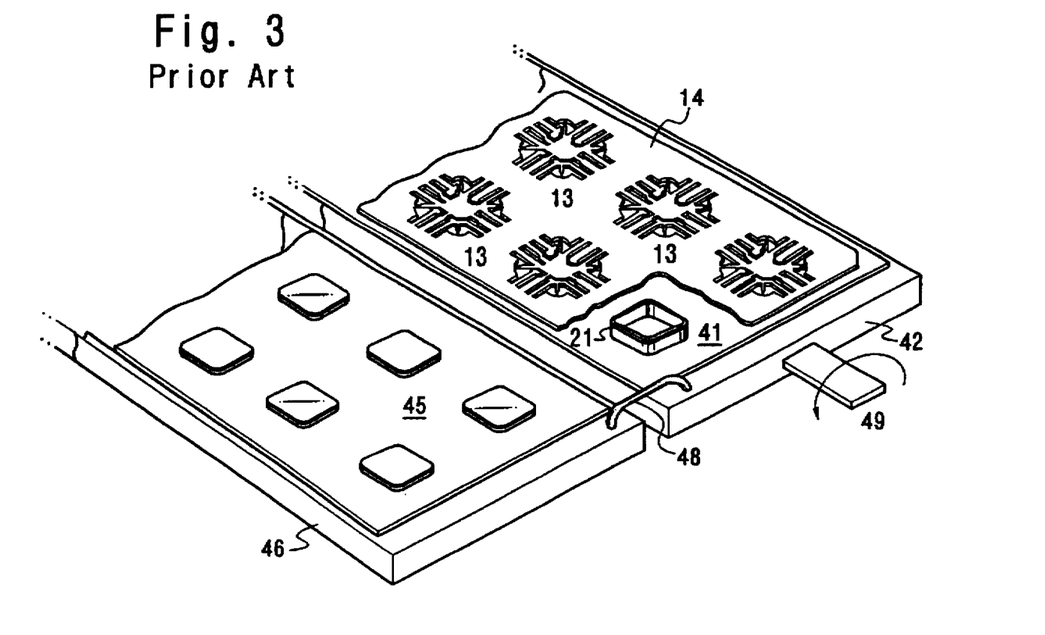
Figures 4, 4A, 4B, 4C:
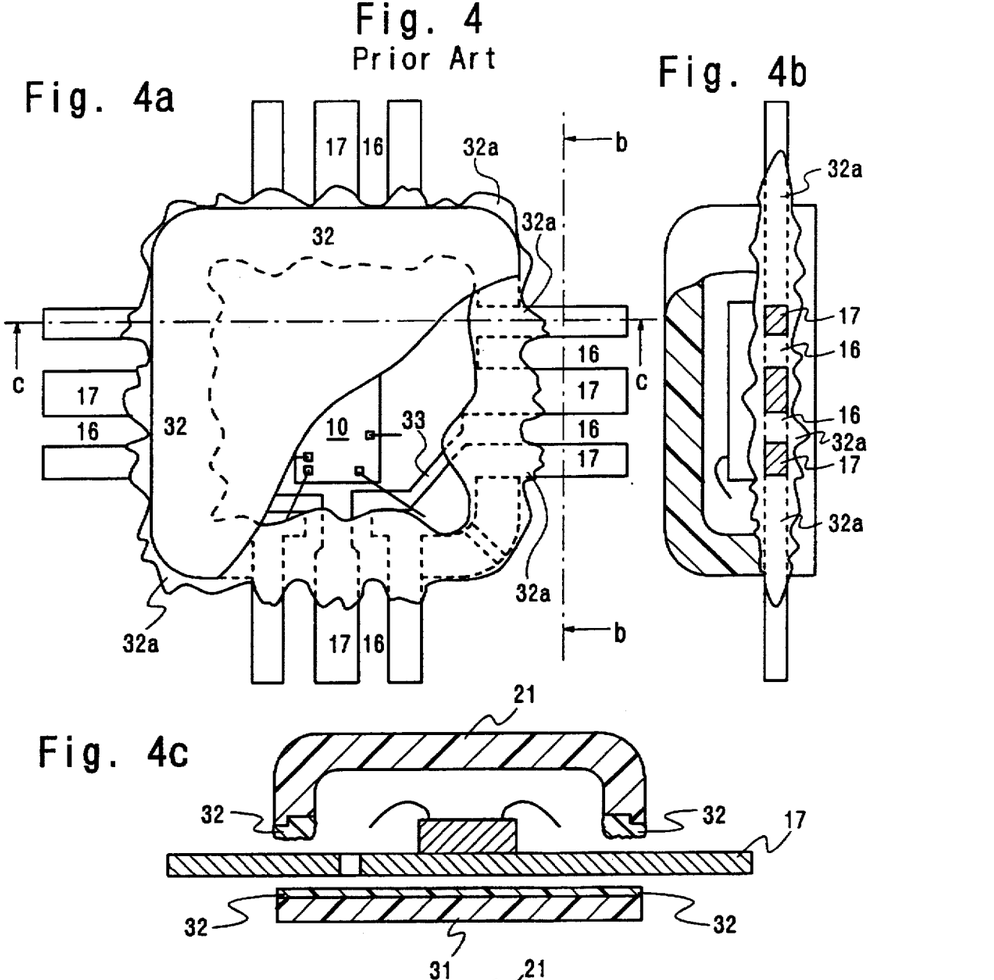

The foregoing method is applied to mass produce the packages by making a large number of the packages at the same time as follows. As illustrated in FIGS. 1b, 3 and 4, predetermined number of channels 16 are stamped out of the conductive base plate 14 to form a conductive lead frame 13. A set of conductive leads 17 are formed by the portion of the base plate 14 left between the channels 16. A plurality of conductive lead frames 13 are formed in the conductive base plate in a similar manner, each having a set of channels 16 and a set of conductive leads 17. Each set of the frame leads become the input and the output leads to the corresponding semiconductor chip bonded onto the base. The input and the output leads extend out from the base 15 of the plate. The base 15 and the set of the input and output leads extending out from the base define a lead frame for each of the packages.

According to the prior art, a backer plate 31 is provided to cover the back side of the base of each of the frames, as shown in FIGS. 1a and 4. The backer plate 31 covers the openings 33 (FIG. 4a) made by the channels 16 in the base within the cavity. Backer plate is coated with the epoxy 32.

Figure 2:
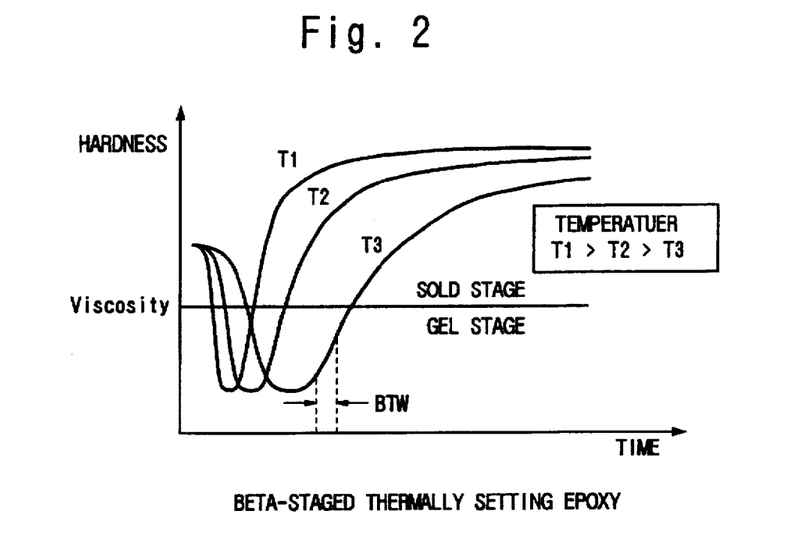
FIG. 2 shows a beta-staged epoxy going from an uncured solid state to a gel and then to the cured solid state when the epoxy is heated at different temperature.

The beta-staged epoxy used to bond the shell and the backer plate to the base has certain characteristics as illustrated in FIG. 2. The epoxy is in a solid, uncured state. When heated to a certain temperature, the epoxy goes through the cycle of first melting into a gel state and then solidifying again and becoming hard and cured, and is stabilized, in the solid state as seen in FIG. 2. The higher the temperature, the process of change take less time. Referring to FIG. 2, the transition from the gel state to the re-solidification provides a time window BTW during which the epoxy should be applied to the things to be bonded. During this time window BTW, the epoxy must be pressed against the surfaces of the element such as the lip of the shell and the input and the output leads to bond the lip to the leads according to the prior art.

A conventional way in which the semiconductor assembly packages are mass produced will now be described with reference to FIGS. 3 and 4. The shell used for the mass production comes tipped with the beta-stage epoxy 32 at the tip face of the shell, as described before. Referring to FIG. 3, the shells are placed in a first receptacle 41. The backer plates 31 come coated with the epoxy 32 in uncured state are similarly lined up with the epoxy side face up in a second receptacle 45. The two receptacles are held in the respective trays 42 and 46. The two trays 42 and 46 are coupled to each other by hinges 48.

The first tray is provided with a handle 49 so that the first tray can be rotated about the hinges to have the first receptacle meet the second receptacle face to face. The frame plate 14 with the lead frames is placed over the tray of shells 21. The lead frames, the shells and the backer plates are pre-aligned so that they will come together to form the corresponding packages with cavities when the first receptacle is rotated about the hinges to meet the second receptacle face to face. The effort is made to bring shells and the backer plates to the base and apply the pressure to establish bond at the isothermal state, that is, the temperature inside and outside the cavity is about the same.

The degree of the softness and the surface tension of the epoxy at the time the contact is made between the epoxy and the frame lead surfaces affect how well the bond is made. These factors are controlled so that the desired surfaces of the parts are bonded together well. For example, the epoxy is not to be too soft to flow into parts of the surfaces where it is not desired. Yet it has to be soft enough to flow into and fill the spaces where it should be. The timing and adjustment of the amount of the pressure applied and the choice of the temperature, and the viscosity and hardness constitute the factors that determine the quality of the bond. Balancing these factors and timing when the epoxy is made to contact during the rather narrow time window BTW (FIG. 2) of the epoxy is found to be difficult to control.

The steps of a known mass production process will be described. The receptacles 42 and 45 are preheated to about 165° C. The shell and the backer plate receptacles 41 and 45 are placed in their respective trays 42 and 46. As the epoxy on the shell and on the backer plate heats up, the epoxy begins to melt and become gelatinous. At a point during the time window, BTW, when the epoxy begins to solidify, the lead frame is placed on the shell so that the lips of the shells meet the corresponding frame leads. This enables the epoxy to bond the lip to the frame leads. This is done by rotating the first tray 42 about the hinges 48 to bring the lead frame with the shells to the backer plates. The shells are brought to contact the base and the backer plates are brought to contact with the bottom of the base plate within the time window BTW when the epoxy is soft enough to fill the spaces but not too soft to flow under pressure.

Pressure of 45 psi (pound per square inch) is applied to squeeze the shell lips against the frame leads and the backer plates against the bases. The application of the pressure is timed to occur within the window BTW as the epoxy begins to solidify. Under the pressure, the molten beta-staged epoxy 32 is squeezed to fill the gap between the lip of the shell and the frame leads 17 and the gap between the backer plate and the bottom of the base plate and the frame leads, as shown in FIG. 4.

The foregoing results in the formation of the air cavities for each of the assembly packages. The assembly packages are kept in the receptacles for about 10 minutes at about 165° C. so that the epoxy solidifies and becomes hard and begins to cure.

The foregoing results in the epoxy bonding the shell to the frame and the backer plate to the bottom of the plate. Next the resulting frame packages are taken out of the tray receptacles and placed in an enclosed oven at about 165° C. for about two hours. These steps cure the epoxy further and stabilizes the cured epoxy.

Figure 4D:
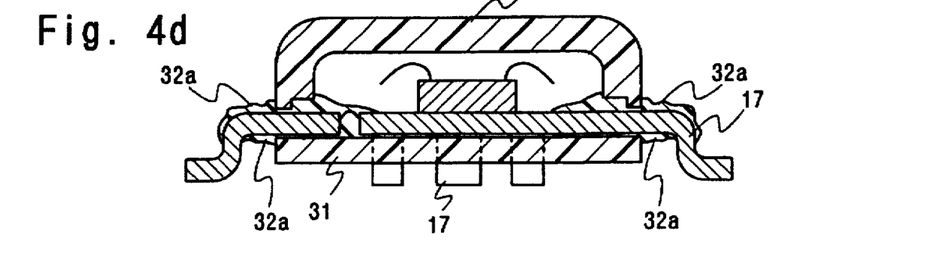
Figure 4E:
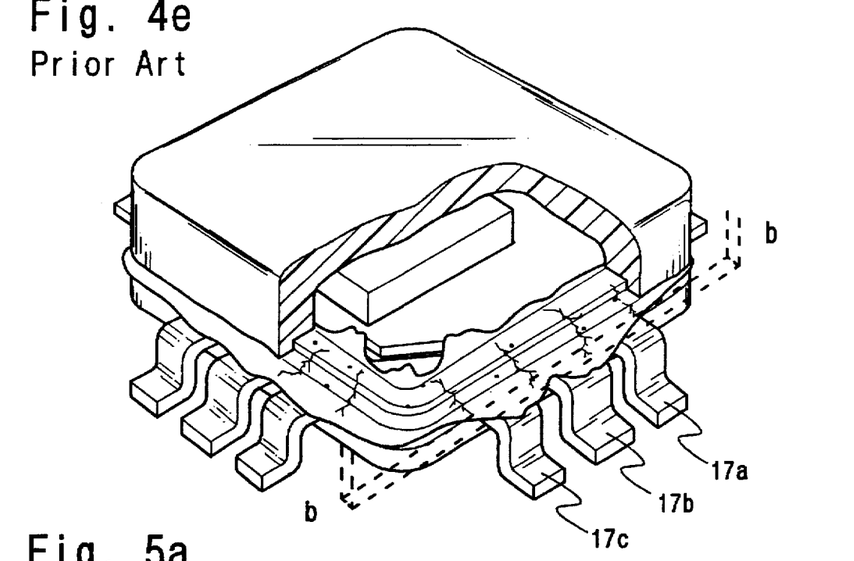
Figure 5A:
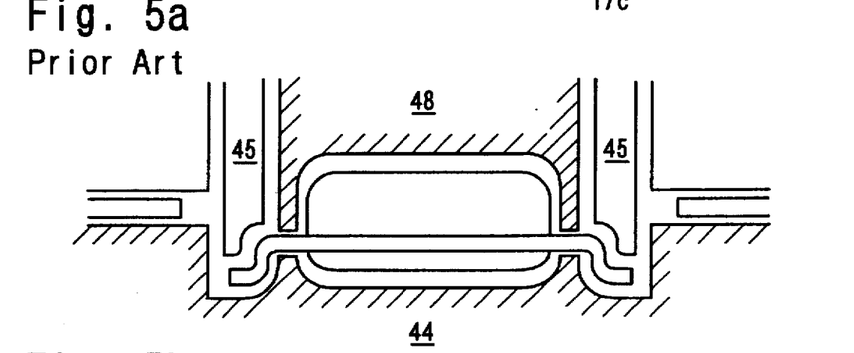
FIG. 5 shows a lead forming tool set that trims and bends the frame leads into gull wings.

After the epoxy is cured the packages in the trays are taken out of the oven. Then each of the packages are separated and the frame leads are trimmed and bent into gull wings as shown in FIGS. 4d and 4e by a conventional means, such as a lead forming equipment shown in FIG. 5. As shown, each assembly package is placed in a die in the equipment. A stripper 48 presses down all of the frame leads against the anvil 44, the form puncher 45 comes down to trim off the end of the frame leads and then bend the leads into the gull wings. Note FIG. 5a is a cross sectional side view of the lead forming equipment along b—b side in FIG. 4e. The equipment has four sides similar to that shown in FIG. 5a to trim and lead all the frame leads on all four sides (FIG. 4a) at once.

The product made by the foregoing method was found to be deficient in many respects. The epoxy 32 (FIG. 4c) tipped to the shell and covering the backer plate 31 are squeezed under the pressure against the base and the frame leads, as explained above. The same pressure also causes the epoxy to ooze out over the frame leads in dribbles 32a and into the cavity as shown in FIG. 4a, b, d, and e. The dribbles 32a of epoxy cover the frame leads, as shown in FIG. 4e cause the epoxy to crack, fissure or open up and separate the lip of the shell from the leads during the trimming and bending operation.

Figure 5B:
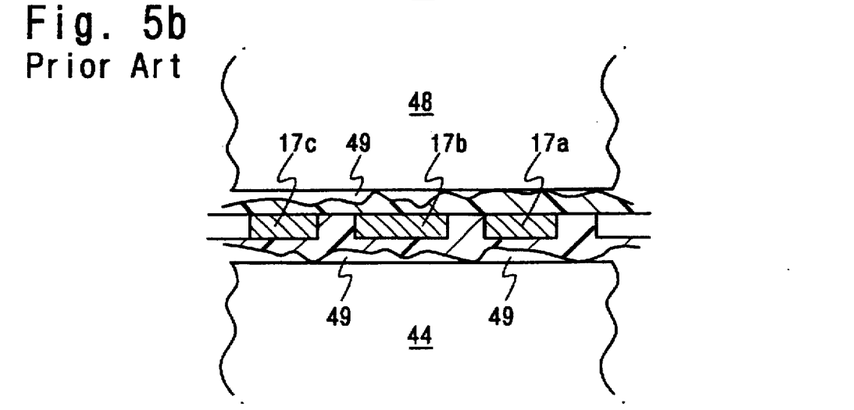

This result is caused by the fact that the irregular dribbles 32a of epoxy cause gaps 49 of different shapes and depths between the stripper 48 and the anvil 44 as shown in FIG. 5b. As the stripper 48 presses the frame leads against the anvil 44, some leads 17a are gripped and others 17b and 17c are not gripped as the stripper 45 comes down to press the leads against the anvil 44 and to bend the leads because the gaps 49 are of non-uniform depth between the dribbles 32a and the anvil 44 and the stripper 48.

Because of the gaps of different depths the stripper and the anvil do not grip all of the frame leads with the same uniform, even and stable pressure. Some leads are gripped and others not. As the form puncher 45 comes down very hard to bend, the leads not gripped firmly move and bend relative to the leads that are gripped tightly and relative to the base. This sends shock waves through the frame leads to the epoxy between the shell lip and the base. This causes the epoxy between the lip and leads to crack or fissures and open the contact between the lip of the shell and base or between the frame leads and epoxy, as shown in FIG. 4e. As a result, the cavity is no longer air tight.

The assembly packages made by the known methods described above were tested, after the frame leads were trimmed and gull winged, according to an accepted industry standard condition "c" gross leak test and accelerated heating and freezing life cycle tests. Very high percentage of the packages failed the tests, indicating that the known method provides poor yield.

Figures 6, 6A, 6B:
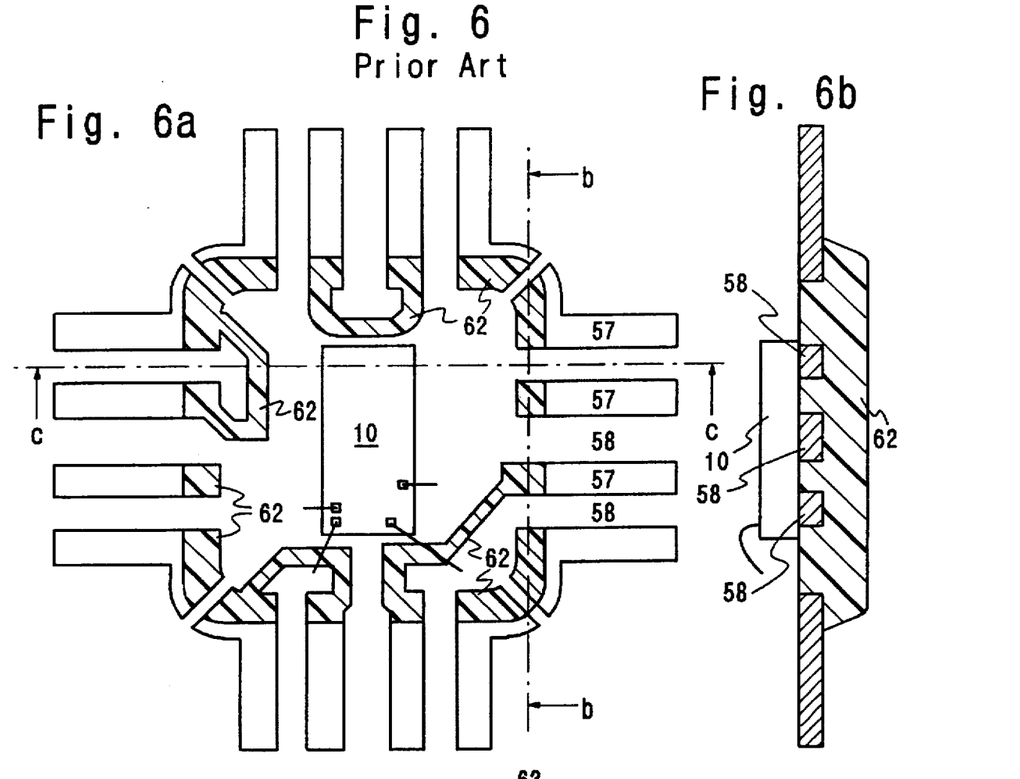
Figure 6C:
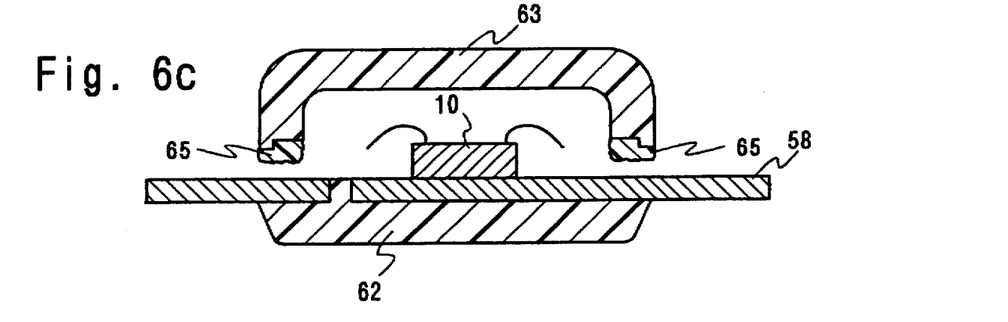

Referring to FIG. 6, another known method will be described. Here each assembly package is made of a shell covering the semiconductor assembly chip and the lip of the shell bonded to the frame leads by the method as described above. The base with the chip and the lead frames come in one piece after they are either injection molded or transfer molded in a conventional manner with plastics(FIG. 6b and c). In the process, the plastic 62 fills the channels 57 between the frame leads 58 and back of the base 52. This is shown in cross hatched form 62 in FIG. 6. The mold is so designed that the surface of frame leads 58 and the plastic 57 are even and level as shown in FIG. 6b.

The pre-molded lead frame with the chip and the shell 63 with its lip 65 tipped with a beta stage epoxy are heated in an enclosed area to about 165°±5° C. The shell is placed on the base against the frame leads in order that the lip meets the frame leads. The shell is pressed at 45 psi to bond the shell to the base to form the cavity as before.

Figure 6D:
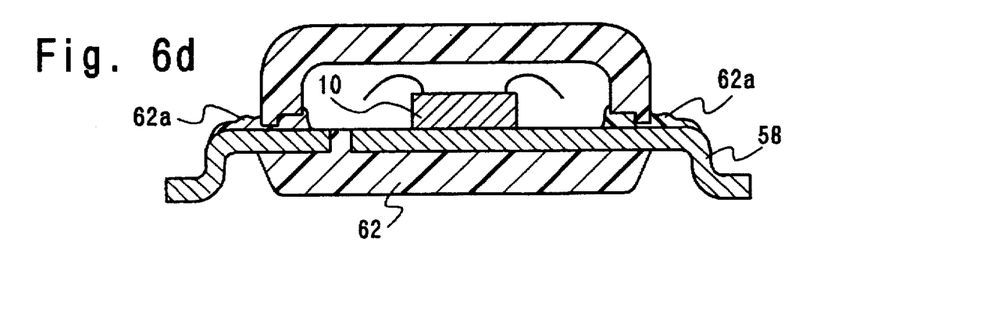

As in the earlier case described above the epoxy oozed out and dribbled over the leads and the base as shown in FIG. 6d. The dribbles 62a on the frame leads formed the irregular and uneven gaps, as before, when the stripper 48 was pressed against the frame leads and the anvil 44. This caused the epoxy between the shell lip and base to crack, fissures or lift the shell lip away from the epoxy (see FIG. 4f), as before. This resulted in a non-tight air cavity.

DETAILED DESCRIPTION OF ILLUSTRATIVE EMBODIMENT OF THE PRESENT INVENTION

The method in accordance with the present invention will be described in making an air tight cavity in an assembly package with reference to FIGS. 7–11. The cavity is defined by a hollow shell 73 covering a base 72, as shown in FIG. 7. The bottom of the base comes pre-molded with plastic 76 as was the case of prior art described with above reference to FIG. 6. The cavity 70 may contain GaAs chip or any s type of product.

Figure 10:
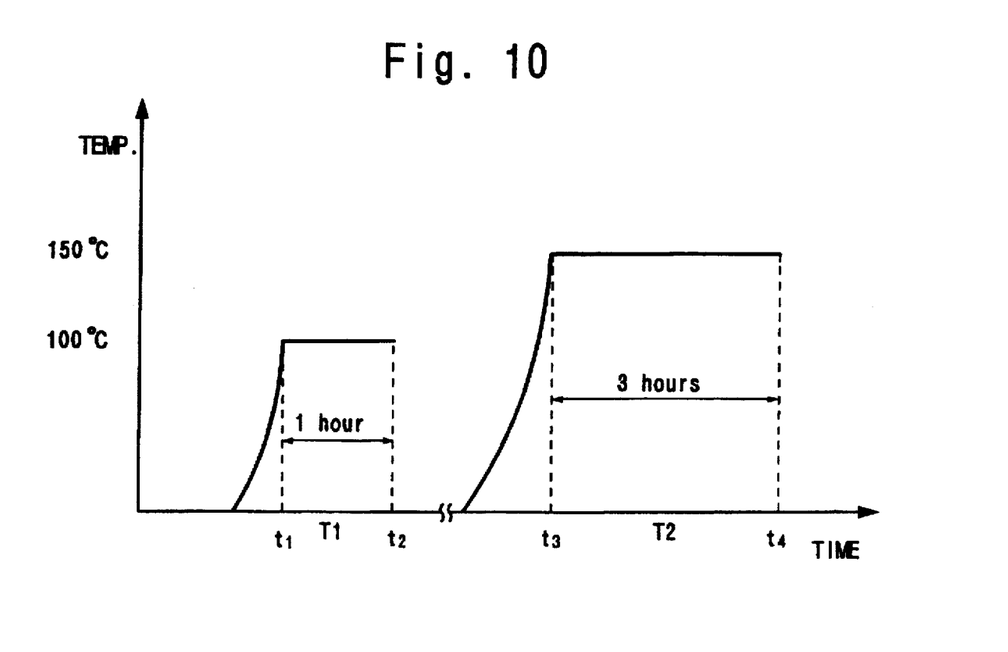
FIG. 10 shows the alpha-staged epoxy undergoing two stages of the curing process.

In making the cavity 70, an alpha-staged thermally setting epoxy, such as a polymide epoxy resin, was used. The alpha-staged epoxy comes in a gel state with different levels of viscosity. FIG. 10 shows the relationship of such an alpha-staged epoxy which is very similar to the beta-staged epoxy except, alpha-staged epoxy comes in a gel in an uncured state, whereas, in contrast, the beta-staged epoxy comes in a solid, uncured state before it is used, as shown in FIG. 2.

Figure 7A:
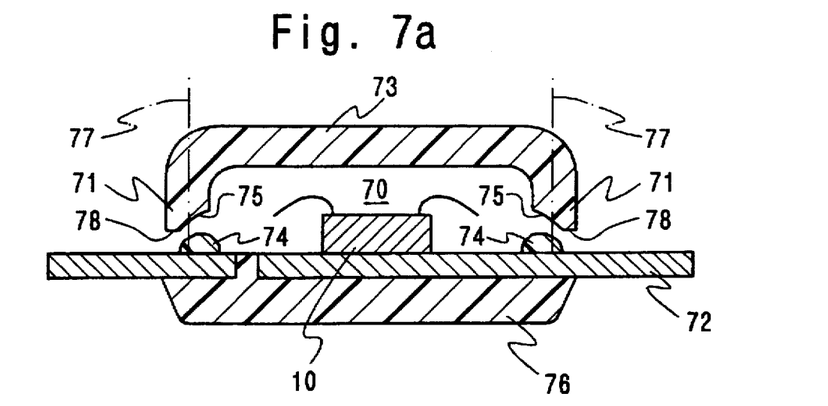
FIG. 7 shows an example of an assembly package made by the present inventive method.

In making the cavity 70, referring to FIG. 7a, first, an alpha-staged thermally setting epoxy 74 with viscosity of a suitable magnitude in the 8000–12200 pois range was dispensed on the base 72, with the base preheated at about 95°±5° C. The area on which the epoxy is dispensed is configured to match the lip of the shell. The shell is placed on the base with less than 20 grams of force by a light tap. The assembly package is heated to about 95°±5° C. for about an hour in the open atmosphere to cure the epoxy (FIG. 10, T1). Note that no external pressure is applied on the shell against the base. The epoxy attaches to the base and to the shell and enables the shell sitting on the base to form a totally enclosed cavity.

Pressure is exerted on the epoxy by the force of the expanding atmosphere in the cavity trying to escape, as the frame assembly package stays heated. The adhesive strength of the hardening epoxy counteracts the pressure of the expanding atmosphere. This enables the epoxy to stay intact and to have the seal stay intact so that the cavity 70 remain air tight. Unlike in the prior art method, the timing as to when the shell is placed on the epoxy is not as critical in that the time window during which the lip of the shell must be placed is relatively wide. This is seen by comparing the window BTW in FIG. 9 to that in FIG. 2.

Next, the assembly package is heated at another elevated temperature for yet another duration to further cure and stabilize the cured epoxy. With the use of the particular epoxy mentioned above, the assembly package was kept in an enclosed oven at 150°±5° C. for about three hours to cure further and stabilize the cured epoxy (see FIG. 10, T2).

As an additional optional step, in the present method, the tip of the lip of the shell was dipped into the epoxy before the shell was placed on the base. This helped the epoxy to provide a more thorough, uniform and even application of the epoxy between the leads and the lip of the shell and further assured the seal to be more air tight.

Figure 7B:
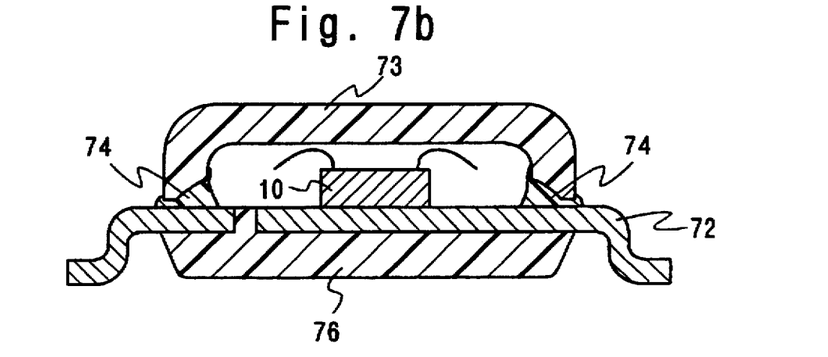

An important aspect of the present invention will now be described with reference to FIG. 7a and 7b. As shown the lip 71 of the shell 73 has the tip 75 surface shaped to provide a tapered recess. The lip protrudes with a narrow tip end 78 with the tapered recess, the recess being on the inside of the tip as shown. Another aspect of the present invention is that the epoxy 74 is dispensed off the center line 77 of the lip 71 closer toward the center of the base such that a bead of the dispensed epoxy forms an enclosed loop somewhat smaller than the loop made by the lip. When the lip is placed on the base 72 and the frame, the epoxy fills the space directly below the recessed and tapered portion of the lip. When the shell is placed on the base, the bead of the epoxy is pushed up toward the tapered recess and inner wall of the lip and epoxy is also pushed out to fill up the space between the tip 78 of the lip and the base, as shown in FIG. 7b. As a result, the epoxy 74 forms a solid contiguous wall shaped as shown which is somewhat thicker than the middle part of the lip and bonds the tip of the lip to the base.

The shaping and bonding of the epoxy is due to the following. First, the shell lip 71 comes down to sit on the epoxy and closes the space between the lip and the base. The shell is tapped lightly down with a force of no more than 20 grams. The epoxy attaches the shell lip to the base and enables the shell and the base to form an enclosed cavity for the element 10, such as a semiconductor chip. The pressure is built up in the cavity as the expanding air forces the epoxy outwardly, as the package is heated. The pressure applied to the epoxy and the affinity of the epoxy to the non-conductive wall of the shell tend to move the epoxy gel upward toward the wall and away from the base which is made of a metal. The epoxy bonding the lip 71 to the base 72 is substantially contiguous with the relatively thick mid portion of the lip as shown FIG. 7b. Note that epoxy does not ooze out and spill over to cover the frame leads, as was the case with a package made by the prior art method, shown in FIG. 4e. This is graphically illustrated in FIG. 7b.

Another application of the present invention will be described now with reference to FIG. 8. The present inventive method was applied to make an air tight cavity for an assembly package, made of a lead frame with conductive leads and base and a GaAs semiconductor assembly chip held in the cavity formed by the shell covering the base such as that shown in FIGS. 1 and 4, without the need for the backer plate.

Figure 8A:
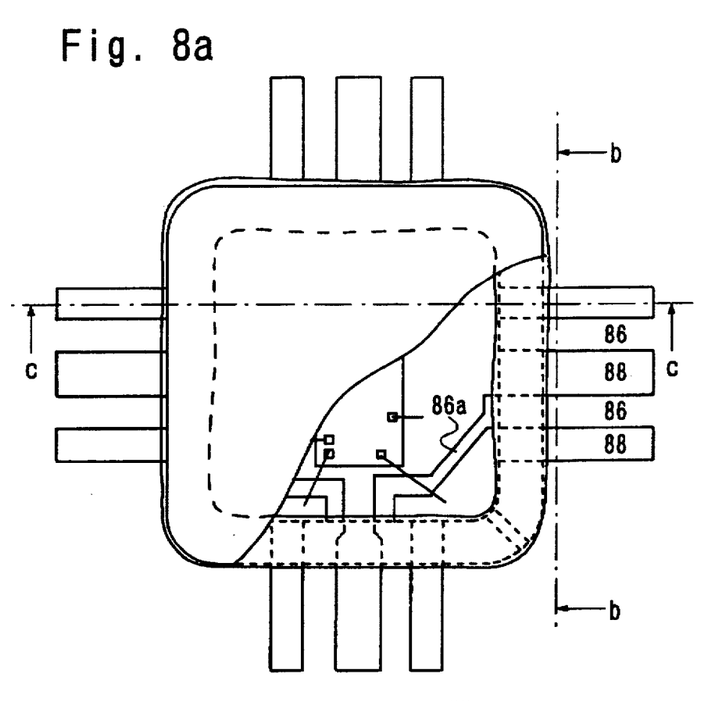
FIG. 8 shows another example of the assembly package made by using the present inventive method.
Figure 8B:
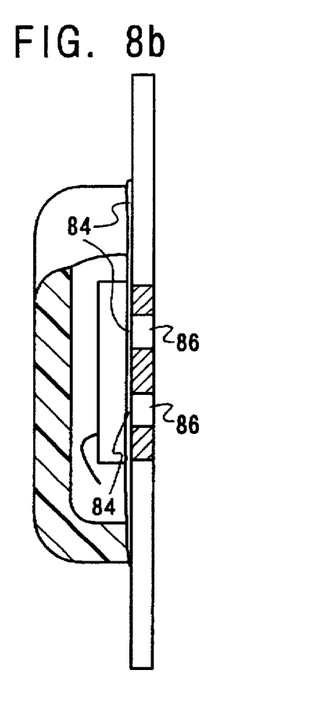
Figure 8C:
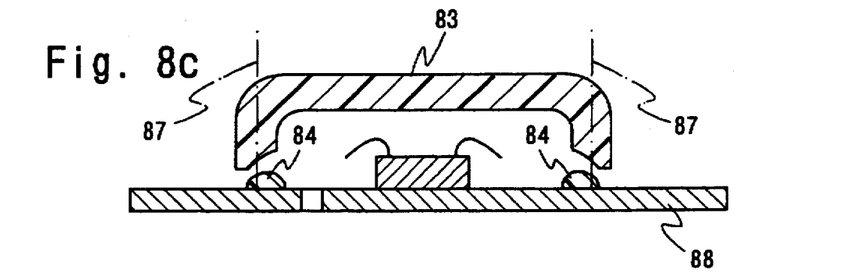
Figure 8D:
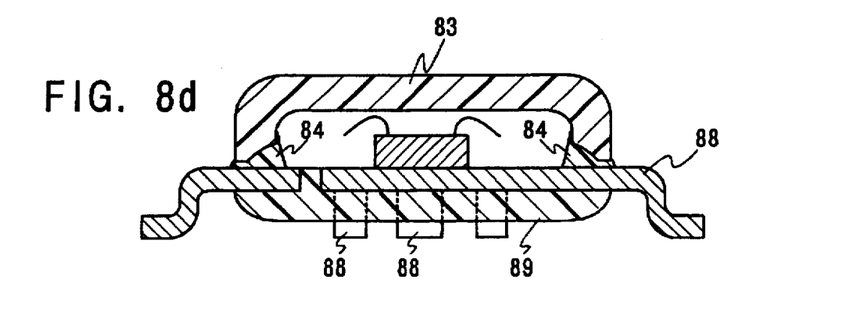
Figure 9:
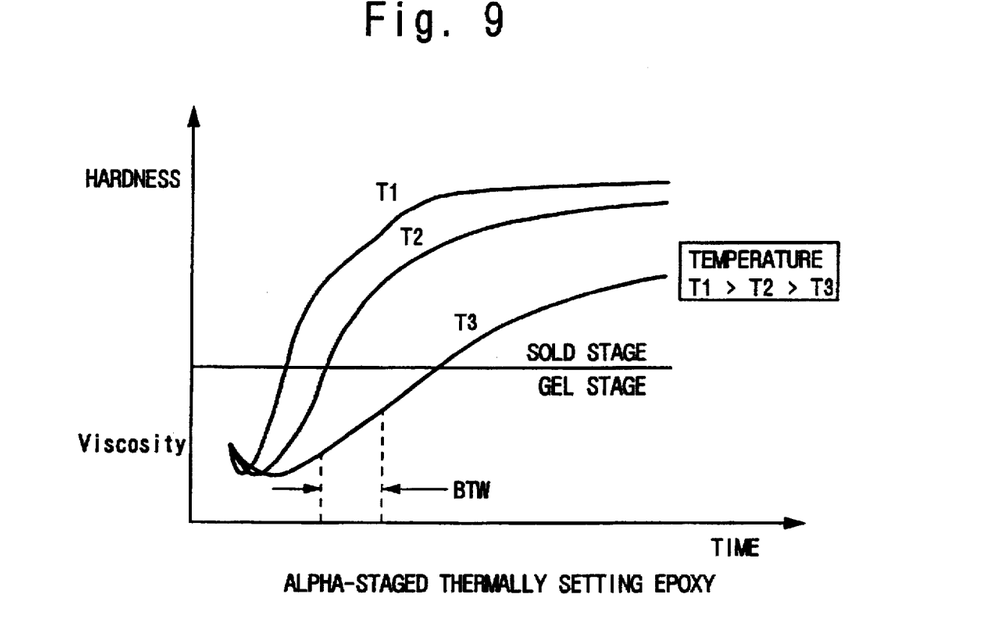
FIG. 9 shows the state of an alpha-staged epoxy going from the gel to hard and cured state over time at different temperatures.

As was done earlier, epoxy 84 was dispensed some what off the center line 81 (FIG. 8b) of the lip of the shell closer toward the center of the base and away from the outer wall of the shell. In one case, an epoxy of 12200 pois viscosity was used. The dispensed epoxy sits on the frame leads and the base, as shown in FIG. 8c. The epoxy forms an enclosed loop to match the lip as described above. When the shell was placed on the base and the frame leads, the epoxy filled the tapered recess under the lip and the tip of the lip and the base as shown in FIG. 8d and as described before, such that the epoxy bonding the lip to the base is substantially contiguous with the relatively thick mid portion of the lip, as shown in FIG. 8d As before, the lip of the shell may be wetted with the epoxy before the shell is placed on the base, if desired.

The following is noted. The bead of the epoxy dispensed on the preheated frame leads bridges over openings 86a made by the channels 86 between the leads, as shown in FIG. 8b. The portion of the epoxy suspended above the channel remains suspended by the surface tension of the epoxy in a gelatinous state. In placing the shell on the frame leads no more than 20 gram of pressure is applied to the shell against the epoxy momentarily by lightly tapping the shell against the base. When the lip of the shell comes in contact with the epoxy, the epoxy sticks to the lip.

Next the package made of lead frame, shell and the epoxy is placed in an oven at about 150°±5° C. for about 20 minutes to cure the epoxy.

Next the lead frame with the shell bonded thereto is flipped over and heated at about 95°±5° C.

Next a thermally setting alpha-staged epoxy 84 with another predetermined viscosity of a suitable magnitude is dispensed over an area on the base opposite the shell. The epoxy covers the leads 88, holes 86a (FIG. 8a) made by the channels 86 and the base of the preheated lead frame. The area covered by the epoxy co-extends the area enclosed by the shell, as shown in FIG. 8d. In the same case mentioned above, the viscosity of 8000 pois was selected to take into account the fact that the openings 86a in the base in the cavity a had width wider than the openings 86 of the channels between the lead covered by the epoxy in the earlier step in bonding the shell over the leads.

Note that in the present method the holes 86a are covered by the epoxy as are the remaining part of the base. The epoxy encloses the atmosphere in the cavity which is being heated and which expands. The expanding air tries to force an opening through the epoxy covering the holes 86a. But the surface tension of the epoxy counteracts the pressure from the expanding atmosphere and seals the cavity air tight.

Restated, in the present invention, the surface tension of the epoxy covering the hole as it hardens is used to counteract the pressure from the expanding atmosphere trying to escape from the cavity. The surface tension also counteracts the force of the gravity that tend to cause the epoxy to fall down through the openings toward the cavity. The epoxy seal over the openings 86a is held in position without puncture during the bonding, heating and curing process.

Next, the assembly package is heated in the open atmosphere at an elevated temperature of 95°±5° C. for a duration of one hour. At the elevated temperature, the atmosphere expands in the cavity, higher pressure is applied against the epoxy, the shell and the base by the force provided by the expanding atmosphere. But the epoxy is hardened to withstand the pressure by now and these forces are not enough to puncture any holes through the epoxy.

Next, the package is further cured by heating and maintaining the package in an oven for three hours at 150°±5° C. to further cure and stabilize the epoxy.

According to yet another feature of the invention, semiconductor s assembly chip such as a GaAs semiconductor chip designed to operate in gigaherz ranges is housed in the cavity. Other types of products such as MMIC or LCD may be similarly housed.

A significant improvement provided by the present invention is that it provides a high yield. This results from the following. As shown in FIGS. 8a and 8d, the epoxy is dispensed on the base off the center line 87 of the lip. When the shell is placed on the base, the recessed and tapered part of the lip comes in contact with the epoxy. The product made by the present method hardly has any dribbles of the epoxy oozing out from between the lip of the shell and the base onto the frame leads, as was the case with prior art described above with reference to FIG. 4.

Figure 11:
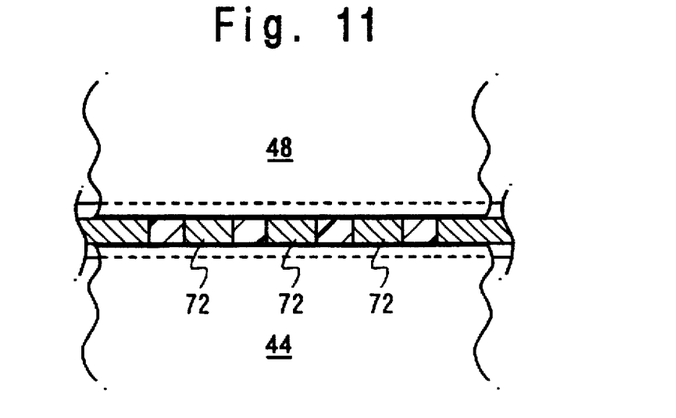
FIG. 11 shows a cross sectional side view of a stripper gripping frame leads against an anvil.

The resulting package is placed in the lead forming equipment (FIG. 5a) as before with the known method described above with reference to FIG. 4. The stripper 48 press the frame leads of the package against the anvil 46. The stripper 48 and anvil 44 contact the frame leads directly, as shown in FIG. 11 due to the fact that there are no dribbles of epoxy as with the prior art process shown in FIG. 5b. As a result, the frame leads are firmly held in position, when the form puncher comes down to bend the leads. So when the puncher 45 bends the frame leads into gull wings, no cracks or fissures or openings occur to the epoxy because it is not disturbed, as in the prior art described above with reference to FIG. 4 and 5. The epoxy bonding the lip to the base remains intact and the cavity is kept sealed and air tight, after trim and form cycle and accelerated heating and cool freezing lip cycle tests. The air tightness of the cavity of the package made by the present invention was verified by subjecting the package to the industry standard condition "c" gross leak test. In excess of 99% of the packages passed the test the condition "c" gross leak test.

Various modification of the present inventive method and inventive product made by the method may be made by the persons of ordinary skills without departing from the spirit and the scope of the present invention.

What is claimed is:

1. A method of making an assembly package having an air tight cavity, said assembly package comprising (1) a base in the form of a lead frame composed of a conductive plate having a plurality of frame leads and a non-conductive backing plate and (2) a shell having a lip about the circumference thereof, the method comprising the steps of:
   (a) dispensing a thermally alpha-staged setting epoxy resin which is characterized as being a gel in an uncured state at room temperature onto said plurality of frame leads of said base;
   (b) heating said base to a temperature in the range of about 90° to about 100° C.;
   (c) placing said shell onto said base such that said lip of said shell rests on the epoxy dispensed onto said heated base, to form an assembly package having a cavity therein;
   (d) heating said assembly package at a first elevated temperature for a period of time sufficient to cure the epoxy and seal the atmosphere expanding in said cavity such that the pressure exerted on the epoxy by the force of said expanding atmosphere within the cavity counteracts against the surface tension of the epoxy being cured, thereby resulting in said cavity being airtight and said epoxy being cured without puncture; and
   (e) heating the assembly package at a second elevated temperature in an enclosed oven for a period of time sufficient to further cure and stabilize the cured epoxy.

2. The method in accordance with claim 1, wherein said assembly package is heated at a first elevated temperature in the range of about 90° to about 100° C. for a period of about 1 hour.

3. The method in accordance with claim 1, wherein said assembly package is heated at a second elevated temperature in the range of about 140° to about 160° C. for about three hours.

4. The method in accordance with claim 1, further comprising the step of dispensing said epoxy to said lip of said shell prior to placing said shell onto said base.

5. The method in accordance with claim 1, wherein said lip of said shell is in the form of a protruding lip having a narrow tip defined by a tapered recess on the inner side thereof and wherein said epoxy is dispensed onto the base in a the form of a continuous loop configured in such a manner that dispensed epoxy fills the tapered recess of said lip when said shell is placed on said base.

6. A method of making an assembly package having an air tight cavity for housing an electrical element therein, said assembly package comprising (1) a base in the form of a lead frame having an upper surface and a lower surface, said upper surface composed of a conductive plate having a pattern of channels punched from said plate, said channels defining a plurality of frame leads, and a non-conductive backing plate joined to said lower surface, and (2) a shell having a lip about the circumference thereof, the method comprising the steps of:
   (a) dispensing a thermally setting alpha-staged epoxy resin which is characterized as being a gel in an uncured state at room temperature onto said plurality of leads and over said channels between said leads in such a manner that a continuous loop is formed which corresponds to said lip of said shell, said epoxy resin having a viscosity sufficient that it does not penetrate the openings of said channels;
   (b) placing said shell onto said base such that said lip of said shell contacts said continuous loop of epoxy resin, thereby forming an assembly package having a cavity therein;
   (c) heating said assembly package at a first elevated temperature for a period of time sufficient to cure said epoxy resin and seal the atmosphere expanding in said cavity such that the pressure exerted on the epoxy by the force of said expanding atmosphere within the cavity counteracts the surface tension of the epoxy being cured, thereby resulting in said cavity being airtight and said epoxy being cured without puncture; and
   (d) heating the assembly package at a second elevated temperature in an enclosed atmosphere for a period of time to further cure and stabilize the epoxy.

7. The method in accordance with claim 6, wherein said assembly package is heated at a first elevated temperature in the range of about 90° to about 100° C. for a period of about 1 hour.

8. The method in accordance with claim 6, wherein said assembly package is heated at a second elevated temperature in the range of about 140° to about 160° C. for about three hours.

9. The method in accordance with claim 6, wherein said shell includes a relatively thick protruding lip having a narrow tip formed by a tapered recess on its inner side, and wherein said continuous loop of said epoxy resin dispensed onto said plurality of leads and over said channels is dimensioned in such a manner that said continuous loop of epoxy corresponds to and fills said tapered recess.

10. The method in accordance with claim 6, wherein following step (b), further comprises the steps of:
   (b1) heating said assembly package;
   (b2) dispensing a second continuous loop of said epoxy resin onto said plurality of leads and over said channels disposed outside said cavity about the outer perimeter of said shell lip.

11. The method in accordance with claim 6, wherein said electrical element is a semiconductor chip.

* * * * *